United States Patent [19]

Charles

[11] 4,427,761
[45] Jan. 24, 1984

[54] PROCESS FOR SURFACE IMPROVEMENT OF SURPRINT PROOF WITH TRANSPARENTIZED PARTICULATE MATERIAL

[75] Inventor: Magalie M. Charles, Staten Island, N.Y.

[73] Assignee: E. I. Du Pont de Nemours and Company, Wilmington, Del.

[21] Appl. No.: 446,226

[22] Filed: Dec. 2, 1982

[51] Int. Cl.$^3$ .............................................. G03C 1/68
[52] U.S. Cl. .................................... 430/291; 430/273; 430/293; 430/358; 430/396; 430/496; 430/950
[58] Field of Search ................. 430/14, 291, 293, 950, 430/273, 496, 358, 396

[56] References Cited
U.S. PATENT DOCUMENTS

| | | | |
|---|---|---|---|
| 4,126,460 | 11/1978 | Okishi | 430/950 |
| 4,229,518 | 10/1980 | Gray et al. | 430/273 |
| 4,321,320 | 3/1982 | Romano | 430/290 |
| 4,334,009 | 6/1982 | Charles | 430/291 |

Primary Examiner—Jack P. Brammer

[57] ABSTRACT

Process for modifying the tacky surface of a surprint multicolor proof having at least two nonplanar, nonsilver halide colored photoimaged elements bonded to a support and an outer photosensitive tacky layer whereby at least one particulate material, 0.1 to 20$\mu$ average particle size, having an oil absorbtivity of at least 30% by weight based on the weight of particulate material determined by Gardner-Coleman Method, ASTM D-1483-60 treated with at least 5% by weight of a transparentizing oil liquid having a boiling point greater than 100° C. whereby the treated particulate material is applied to the tacky surface and the excess material is removed. The proofs obtained are excellent matches to press proofs on various surfaces.

12 Claims, 2 Drawing Figures

PROCESS FOR SURFACE IMPROVEMENT OF SURPRINT PROOF WITH TRANSPARENTIZED PARTICULATE MATERIAL

DESCRIPTION

1. Technical Field

This invention relates to a process for modifying a tacky surface of a surprint proof. More particularly this invention relates to the use of at least one particulate material capable of absorbing oil, treated with a transparentizing oily liquid to modify the tacky surface of a surprint proof.

2. Background Art

Photoimaged elements are known which are useful in the printing and proofing industry. In the preparation of color proofs in particular it is desirable to modify the light reflectivity of the photoimaged element. The modification of the light reflectivity of the outer surface of a color proof results in a matte finish.

Photosensitive materials used in colorproofing are of the positive- or negative-working types. A positive-working process is described in Chu and Cohen U.S. Pat. No. 3,649,268. Positive-working materials contain tacky photohardenable compositions which when exposed imagewise to actinic radiation harden in the exposed image areas resulting in tacky and complementary nontacky image areas. The image areas which remain tacky can be developed by applying colored powders such as toners and pigments. A negative-working process is described in Cohen and Fan U.S. Pat. No. 4,174,216. Negative-working elements useful in the negative-working process comprise a support, a tacky, nonphotosensitive contiguous layer, a photohardenable photoadherent layer and a strippable cover sheet. After imagewise exposure to actinic radiation the cover sheet is peeled away together with the exposed areas of the photoadherent layer revealing the tacky contiguous layer beneath. The photoadherent layer in the unexposed image areas remains as a resist over the complementary portions of the contiguous layer. The tacky contiguous layer revealed in the exposed image areas is then toned with pigment. Layers toned with different pigments can be applied in registration over one another to form multilayer color proofs. A tacky photosensitive, e.g., photohardenable, layer generally is present as the outer layer of the proof whether it be of the positive- or negative-working types. Dependent on the thickness of the layers, the proof may exhibit a pronounced undesirable three-dimensional effect.

Many methods have been used to provide the positive-working materials and/or negative-working materials with matte finishes. Such methods include wet as well as dry systems, the latter being particularly desirable. Particulate materials of the oil-absorbing type have been applied to positive-working systems. in this instance, the degree of matte can be controlled to some extent by imaging through a halftone screen followed by applying the particulate material. This procedure is, however, not entirely effective in controlling the degree of matte over a wide range of gloss. A method for controlling the degree of matte without the use of a pre-exposure step is described in Charles and Heiart U.S. Pat. No. 4,334,009. This is made possible by admixing particulate material, e.g., cellulose acetate, polyvinyl alcohol, diatomaceous silica, starches, etc., with inert carrier particles, e.g., polymethylmethacrylate, polyethylmethacrylate, polyethylene, polyvinyl chloride, ionic copolymers of $\alpha$-olefins and $\alpha,\beta$-ethylenically unsaturated carboxylic acid having from 3 to 8 carbon atoms, etc., as described, and applying the admixture to the tacky surface of a surprint proof and removing excess particulate material together with all the carrier particles. While the process described in U.S. Pat. No. 4,334,009 is useful for controlling the degree of matte it has been found that when the admixture is used in automatic toning machines, e.g., of the type described in Tobias U.S. Pat. No. 4,069,791 the high quality of cleanup required in commercial operations is not always achieved.

It is desired that a method be provided whereby the degree of matte of a tacky surface can be effectively controlled and the three-dimensional effect eliminated, when present, by a substantially dry process which can use a variety of particulate materials without the need for carrier particles. The process is also effective when used in conjunction with automatic toning devices as well as in conjunction with hand toning operations.

BRIEF DESCRIPTION OF THE FIGURES

In the accompanying Figures forming a part of this disclosure.

DISCLOSURE OF INVENTION

Figure 1:
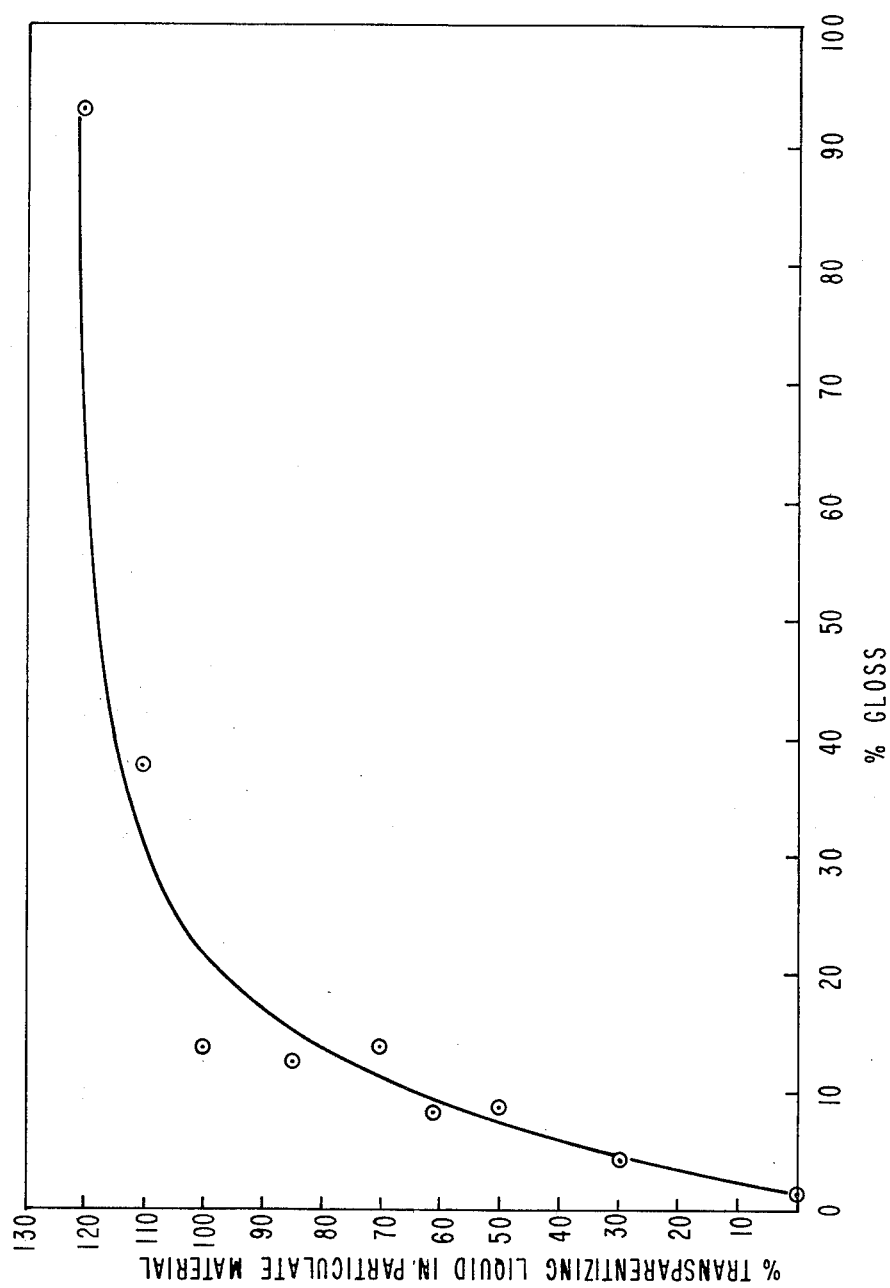
FIG. 1 illustrates the plotting of percent gloss measured on the surface of photopolymer proofs as described in Example 3 below when cellulose acetate particulate material, 4–7$\mu$ average particle size, treated with a transparentizing oily liquid, Merpol ®SE, a nonionic wetting agent made by condensation of ethylene oxide, E. I. du Pont de Nemours and Company, Wilmington, Del., in various amounts is applied to said surfaces. The curve shows the percent gloss increases as the percent of transparentizing liquid present in the particulate material increases up to 120% by weight based on the weight of the particulate material.

In accordance with this invention there is provided a process for modifying a tacky surface of a surprint multicolor proof having at least two nonplanar, nonsilver halide colored photoimaged elements sequentially bonded to a support, and a photosensitive tacky layer present as the outer layer of the proof by adhering to the tacky layer at least one particulate material having an oil absorptivity of at least 30% by weight based on the weight of particulate material as determined by the Gardner-Coleman Method, A.S.T.M. D-1483-60 and an average particle size of 0.1 to 20$\mu$ which comprises (1) applying the particulate material to the tacky surface, and (2) removing excess particulate material therefrom, the improvement wherein prior to application to the tacky surface the particulate material is treated with at least 5% by weight of a transparentizing oily liquid having a boiling point greater than 100° C. whereby the particulate material is made transparent.

The term "transparentizing oily liquid" as used herein means the oily liquid used to treat and transparentize the particulate material prior to application of the particulate material to the tacky surface of a surprint proof. "By transparentizing" is meant the particulate material treated with the oily liquid will impart gloss to the tacky surface of a surprint proof treated therewith, i.e., a high gloss indicates that the particulate material has been transparentized.

In practicing the process of the invention the tacky surface that is modified is the photosensitive tacky protective surface of a positive- or negative-working surprint proof which are described in Chu and Cohen U.S. Pat. No. 3,649,268 and Cohen and Fan U.S. Pat. No. 4,174,216, respectively. These patents are incorporated by reference. The positive-working photohardenable elements comprise (1) a removable support, (2) a photohardenable or photopolymer layer containing at least one free radical initiated, chain propagating, addition polymerizable compound containing at least one terminal ethylenic group, and an addition polymerization initiator activatable by actinic radiation, and, optionally a compatible macromolecular organic polymeric binder, and (3) a strippable cover sheet. The negative-working elements comprise, in order from top to bottom, (1) a strippable cover sheet, (2) a photoadherent layer comprising a material with ethylenically unsaturated or benzophenone type groups, which is generally nontacky, (3) a tonable organic contiguous layer, e.g., a tacky, nonphotosensitive elastomeric layer which is tonable by application of particulate material, and optionally (4) a sheet support.

The positive-working and negative-working elements can be used to form surprint elements. Surprint elements are elements wherein at least two photosensitive elements that have been imaged and colored with different colorants (nonplanar, nonsilver halide colored, photoimaged elements) are sequentially laminated or bonded to a suitable support surface, e.g., paper, film, etc. In forming a surprint element, the cover sheet and any sheet support present in the photosensitive elements are removed. Generally a negative-working or positive-working photosensitive element is applied to the outermost colored photoimaged element of the surprint element. When the outer element of the surprint is a negative-working element, it is uniformly or nonimagewise exposed, the cover sheet present is removed together with the exposed adherent photosensitive layer, leaving a tacky, nonphotosensitive layer on the surprint. The tacky layer is then treated with transparentized particulate material according to the invention.

Generally, the surprint element has over its support four imaged colored photopolymer elements, e.g., yellow, magenta, cyan, black, and an optional fifth nonimaged photopolymer element. A multicolor surprint element prepared by the surprint method is described in U.S. Pat. Nos. 3,649,268 and 4,174,216. Colorants and toners used in preparing the surprints are described in U.S. Pat. Nos. 3,620,726, 3,909,326 and 4,286,046, which are incorporated by reference.

The outer tacky surface of the surprint is modified by application thereto of transparentized particulate material, i.e., particulate material that has been treated with a transparentizing oil liquid prior to application to the tacky surface. Subsequently excess particulate material can be removed by wiping, etc., as is known to those skilled in the art. The particulate material may consist of one or more of the materials listed below, 0.1 to 20μ, preferably 2 to 15μ average particle size. The particle size can be measured, for example, by a Coulter Counter, Coulter Electronics, Inc., Hialeah, Fla. Suitable particulate materials are those materials which absorb at least 30% by weight based on the weight of the particulate material, preferably 40 to 200% by weight, of oil as determined by the Gardner-Coleman Method, ASTM D-1483-60. Such materials include: starches, e.g., corn, rice; diatomaceous silicas, e.g., those produced by Johns-Manville Products Corp. under the trademark Celite ®, Superfloss ® and Celite ® White Mist; cellulose acetate, silica-gel, vegetable powders, e.g., those sold by Holland Ink Corp., Mineola, N.Y., under the trademark Van-Son ®, etc., and mixtures thereof.

As stated above, the above-described particulate materials are treated with at least 5% by weight of a transparentizing oily liquid preferably 10 to 30% by weight. The transparentizing oily liquid can be applied to the surface of the particulate material or the particulate material can be mixed with the oily liquid. Preferably when a mixture of particulate materials is used the oily liquid is added to the mixture, preferably in a blender. The invention is not limited to the method of mixing the oily liquid with the particulate material as methods known to those skilled in the art can be used. Suitable transparentizing oily liquids which boil above 100° C. include: nonionic condensation product of ethylene oxide (manufactured by E. I. du Pont de Numours and Company, Wilmington, DE under the registered trademark Merpol ®SE nonionic wetting agent), mineral oil, silicon oil, nonionic polyoxyethylene lauryl ether (manufactured by ICI America, Inc., Wilmington, DE under the registered trademark Brij ®30), a quarternary ammonia surface active agent (a reaction product of polyethylene oxide/polypropylene oxide/C18 tallow/ethyl) (manufactured by E. I. du Pont de Nemours and Company, Inc., Wilmington, DE under the registered trademark Avitex ®LCP), a mixture of monomeric compounds, e.g., trimethylolpropane triacrylate and triacrylate of oxyethylated trimethylolpropane, etc. Other oily liquids are useful provided that they are able to transparentize particulate material within the percentage ranges stipulated.

After the surprint proof with the tacky positive-working photohardenable layer is prepared and prior to application of the transparentized particulate material, the surprint proof optionally may be exposed to actinic radiation through a screen tint. Screen tints which can be used to control exposure of the tacky surface are those which have a tint value (positive percent dot area) of 25 to 75 percent with a ruling corresponding to 85 lines to 400 lines per inch (33.46 to 157.5 lines per cm), preferably 225 to 325 lines per inch (88.58 to 127.95 lines per cm). Preferred screen tints are those with a random photographic pattern, referred to in the trade as a "grained tint" or "mezzotint". Also useful are standard ruled tints (halftone screen tints). The exposure can be by various sources rich in ultraviolet radiation known to those skilled in the art, e.g., mercury vapor lamps, pulsed xenon lamps, Berkey-Ascor Vacuum Printer, devices described in the examples below, etc., generally for a period of 10 seconds or more.

Figure 2:
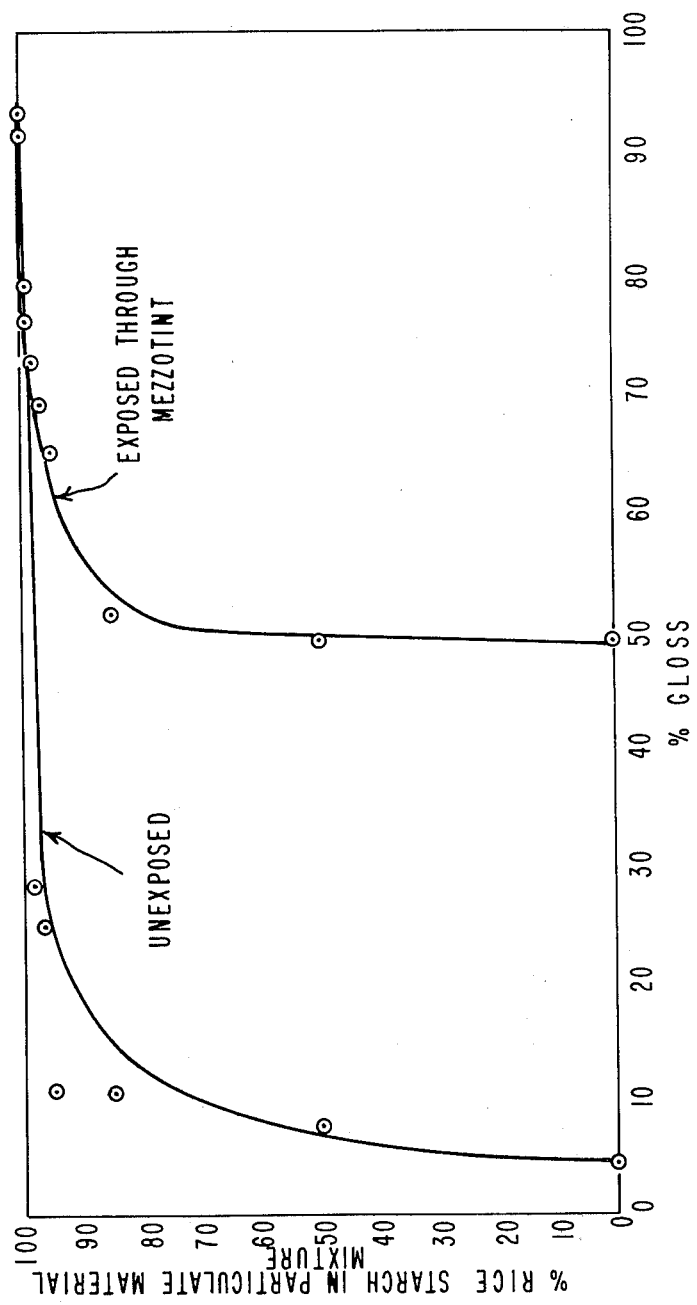
FIG. 2 illustrates the plotting of percent gloss measured on the surface of photopolymer proofs described in Example 4 below when the percent rice starch, 7$\mu$ average particle size, in a mixture with cellulose acetate particulate material, 4–7$\mu$ average particle size, both treated with 30% by weight of the transparentizing oil liquid described above in FIG. 1, varied from 0 to 100% by weight is applied to said surfaces. The left curve represents no exposure of the proof surface prior to application of the particulate material mixture. The right curve represents a 15-second exposure through a mezzotint as described in Example 1 below prior to application of the particulate material mixture. In both curves the percent gloss increases as the amount of rice starch in the mixture increases, the curve representing the pre-exposure through the mezzotint having a percentage of gloss ranging from 49.0% to 93.4%.

The unexposed tacky surface or the tacky surface exposed to actinic radiation through a screen tint is then modified by applying the transparentized particulate material. The particulate material can be applied to the tacky surface by use of a fiber pad dipped into the particulate material and wiped over the tacky surface, by an applicator such as described in Sandner U.S. Pat. No. 4,019,821, or in an automatic toning device described in Tobias U.S. Pat. No. 4,069,791, both of which are incorporated by reference. The "glossiness" of the treated surface is plotted in percent gloss determined by a Gardner Precision Glossmeter, 66 9110, with a 75° angle manufactured by Gardner Laboratory, Inc., Bethesda, MD. Other glossmeters can be used with comparable results. As illustrated in FIG. 1 high gloss is achieved with a higher percentage of transparentizing oily liquid in the particulate material. As illustrated in FIG. 2 high gloss is achieved as the percentage of rice starch transparentized particulate material in the mixture increases. Not only can the degree of gloss or matte of the tacky surface be controlled, but the surface can also be tinted by adding to the admixture a small amount, e.g., about 0.1 to about 10% by weight of a particulate colored pigment or toner as described above. Generally, in tinting, the components of the admixture other than the pigment or toner are colorless or translucent. In lieu of the small amount of particulate colored pigment or toner a small amount of either untreated particulate material or treated but untransparentized particulate material can be used with the transparentized particulate material. This treatment may be useful in more particularly simulating a press proof.

BEST MODE FOR CARRYING OUT THE INVENTION

The best mode is illustrated in Example 6 wherein a four-color negative color proof having a fifth, clear photopolymer layer laminated thereover is treated with an admixture of particulate materials, previously treated with 15% transparentizing liquid. The particulate material mixture is applied in an automatic toning device as described in Tobias U.S. Pat. No. 4,069,791. A surprint proof which simulates a press proof is obtained.

INDUSTRIAL APPLICABILITY

The process of this invention results in improved delustering of multicolor surprint proofs which improves the match to press proofs on various supports, e.g., paper stocks, etc. The glossiness of the surface can be modified over a wide range. The treated multilayer surprint proof is free from the three-dimensional effect, if present. The matte surface is durable and nonblocking and is capable of being written on by writing devices such as pencil, pen and crayon. The process is versatile in that small amounts of colored or uncolored particulate material can be added together with the transparentized particulate material. The treated surface can be tinted and delustered simultaneously. The cleanup, particularly in automatic toning devices is also improved.

EXAMPLES

The following examples illustrate the invention wherein the parts and percentages are by weight. Molecular weights of polymeric compounds are number average molecular weights (Mn) and are determined by gel permeation chromatography employing a known standard, e.g., polybutadiene, polymethylmethacrylate, etc., as known to those skilled in the art.

EXAMPLE 1

A photopolymerizable composition is prepared by mixing together the following ingredients:

| Ingredient | Amount (parts) |
|---|---|
| Polymethylmethacrylate, molecular weight 30,000, density 1.13 g/cc | 32.40 |
| Trimethylolpropane trimethacrylate | 35.60 |
| 2-o-Chlorophenyl-4,5-bis-(m-methoxyphenyl) imidazolyl dimer | 1.58 |
| 2-Mercaptobenzothiazole | 0.79 |
| Polyoxyethylene lauryl ether | 7.90 |

The mixture is dissolved in methylene chloride (20% solution) and is coated onto a 0.001 inch (0.0025 cm) thick polyethylene terephthalate support and a 0.001 inch (0.0025 cm) thick cover sheet of polypropylene is laminated onto the coating at room temperature. The cover sheet is removed at room temperature with substantially no effect on the photopolymerizable layer, and the layer is laminated at about 110° C. to the smooth side of Kromekote ® cast-coated one-side paper, manufactured by Champion Paper and Fiber Company on a fixed-bed transfer machine as described in Chu et al. U.S. Pat. No. 3,594,535, incorporated by reference. The photopolymer layer is exposed at a distance of about 27 inches (68.6 cm) through a minus-blue separation halftone positive for about 8 seconds using a nuArc ® Plate Maker "Flip Top", Model FT26M-2 carbon arc light source. The polyethylene terephthalate support is removed at room temperature and Dalamar ® yellow toner (Pigment yellow 74 C.I. #11741) prepared according to Example 9 of Manger et al., U.S. Pat. No. 4,215,193 is applied to the photopolymer surface. Excess toner is removed with a cotton pad. The toner adheres only to those areas that were not exposed to the radiation.

The cover sheet is removed from a second element coated with the above-described composition, and the clear photopolymer layer is laminated onto the yellow-toned layer, obtained above, at a temperature of 110° C. The two-layer film base is exposed through a minus-green separation halftone positive for 3 seconds using the nuArc ® light source. The base support is stripped from the photopolymer, and a magenta toner, a dispersion consisting of 50 percent mixture of quinacridone magenta, Quindo Magenta (C.I. Pigment Red 122) and Indo Brilliant Scarlett toner (Pigment Red 123, C.I. #71145) and 50 percent cellulose acetate, prepared as described in Example 11 of U.S. Pat. No. 4,215,193, is applied to the exposed surface at room temperature. The excess toner is dusted off with a cotton pad, the pigment adhering to the underexposed areas only.

The cover sheet is removed from a third photopolymerizable element coated with the above-described composition and the clear photopolymer layer is laminated onto the magenta-toned layer, obtained above, at a temperature of 110° C. This is exposed through the minus-red halftone positive for 3 seconds using the nuArc ® light source. The polyethylene terephthalate support is removed from the layer, and a phthalocyanine cyan toner, a dispersion of 50 percent mixture of Monastral ® Blue G (Copper Phthalocyanine Pigment Blue 15, C.I. #74160) and Monastral ® Green G (Pigment Green, 7, C.I. #74260) and 50 percent cellulose acetate prepared as described in Example 1 of U.S. Pat. No. 4,215,193 is dusted onto the exposed surface at room temperature. The excess toner is removed with a cotton pad, leaving pigment in the underexposed areas only.

A fourth photopolymerizable layer is laminated onto the cyan-toned layer of the three-layer film base using the same procedure and under the same conditions used in preparing the two previous layers. The fourth layer is exposed through a black printer halftone positive for 3 seconds using the nuArc ® light source. After stripping off the polyethylene terephthalate support, a carbon black toner, Carbon Black, Sterling ® NS N774 (C.I. Pigment Black 7, C.I. #77266) prepared as described in Example 10 of U.S. Pat. No. 4,215,193, predispersed in pentaerythritol resin is applied to the exposed surface at room temperature. The excess pigment is dusted off with a cotton pad, leaving pigment in the underexposed areas only.

After application of the black toner, as described above, a fifth photopolymerizable layer is laminated at 110° C. over the four-color, halftone positive element. This leaves an image which is glossy and exhibits a slight three-dimensional effect and is not considered to be a match for a press proof. To match the press proof the following procedure is performed. A mixture of particulate materials (powders) is prepared by blending one Part of rice starch of ca. 7.0µ particle size (Stein-Hall & Co., Inc. of New York, New York) with two parts of cellulose acetate of ca. 4–7µ particle size (Eastman Chemical Co., Knoxville, TN) in a suitable "V" blender. While these two particulate materials are mixing a transparentizing oily liquid (15% of the combined powders) Merpol ®SE, a nonionic wetting agent made by the condensation of ethylene oxide (E. I. du Pont de Nemours and Company, Wilmington, DE) is added and the entire mixture blended thoroughly for about 0.5 hour.

A screen tint (mezzotint) with 55 positive percent dot area derived from a Policron ®GKKK Neutral Fine Grain Screen prepared and manufactured by Policrom Photo Products S.p.A., Bergamo, Italy, is applied over the polyethylene terephthalate support for the fifth layer described above. This sandwich of screen/proof is then placed in the vacuum frame and exposed for about 15 seconds as previously described. The support is then stripped off and the mixture of particulate materials treated with the oily liquid is applied by means of a fiber pad dipped therein and wiped across the fifth layer. The surface is then wiped with a cotton cloth to remove the excess mixture of particulate materials. The final, four-color proof has a remarkable, uniform matte finish that closely simulates a press proof and is durable, nonblocking, resistant to cracking and crazing and deterioration over a long period of time at ambient temperature. The surface has no three dimensional effect and can be written on with pen, pencil or crayon.

EXAMPLE 2

A negative-working pre-press color proof of the surprint type is prepared as follows:

I. Nontonable Photopolymerizable Layer

A coating solution of a photopolymerizable composition is prepared by mixing together the following ingredients:

| Ingredient | Weight (g) |
| --- | --- |
| Polymethyl methacrylate (MW 200,000–300,000) | 41.54 |
| Di-(3-acryloxy-2-hydroxypropyl) ether of Bisphenol-A | 51.86 |
| (2-Chlorophenyl-4,5-diphenyl imidazolyl) dimer | 2.20 |
| 2-(Stilbyl-4")-(naptho-1',2';4,5) 1,2,3-triazol-2"-sulfonic acid phenyl ester | 2.20 |
| 2-Mercaptobenzoxazole | 1.50 |
| Polyethylene oxide (MW 600,000) | 0.70 |
| Methanol | 20.70 |
| Methylene chloride | 323.70 |

This solution is coated at a coating weight of about 40 mg/dm$^2$ when dried on a clear polyethylene terephthalate film having a thickness of 0.0005 inch (0.0015 cm) which is surface treated by electrostatic discharge at 0.07 coulombs/ft$^2$ (0.093 coulombs/m$^2$).

II. Tonable, Tacky Elastomer Contiguous Layer

A coating solution is prepared by mixing together the following ingredients:

| Ingredient | Weight (g) |
| --- | --- |
| Random copolymer of styrene/butadiene (40/60) | 19.75 |
| Cis-polybutadiene (Mooney Viscosity 55-14 60) | 79.75 |
| Tetra-bis-[methylene 3-(3',5'-di-t-butyl-4'-hydroxyphenyl) propionate] methane | 0.50 |
| Methylene chloride to make | 1333.30 |

This solution is coated on polyethylene terephthalate film having a releasable layer of polydimethyl siloxane coated thereon to give a coating weight of about 125 mg/dm$^2$ when dried.

III. Laminating Procedure

The supported photopolymerizable layer (I) and the supported tonable, tacky elastomer contiguous layer (II) are laminated in surface-to-surface relationship at room temperature with a pressure of about 40 psi (2.81 kg/dm$^2$).

IV. Operations for Preparation of a Surprint

The laminate (III) is further handled as follows:

The polyethylene terephthalate film with the siloxane release coating is stripped from the tonable, tacky layer and the resulting element is then laminated at 100° C. to a 0.012 inch (0.03 cm) thick paper support (identified as Baryta Paper, marketed by the Intermill Corporation, Belgium). The element is then exposed to a halftone negative, minus-blue, color separation film record, the exposure being made through the electrostatic discharge treated, clear polyethylene terephthalate film. This exposure is about 30 seconds on an exposing device identified as a Berkey-Ascor Vacuum Printer, fitted with a photopolymer lamp (2 KW) and a Kokomo ® glass filter (No. 400) Kokomo Opalescent Glass Co., Kokomo, IN. The distance between the lamp and the vacuum frame of this device is about 38 inches (96.52 cm). After the exposure is made, the exposed element is taped securely to a suitable flat surface, and the clear polyethylene terephthalate film cover sheet is stripped by pulling at one corner with an even, continuous motion at an angle of about 135°–180°. The resulting exposed, photopolymerized image photoadheres to the electrostatic discharge treated film and is removed with the film thus exposing equivalent areas of the tacky, elastomer contiguous layer on the paper support. The bared areas of the contiguous layer are toned using a yellow toner, Dalamar ® Yellow (Pigment Yellow 74, C.I. No. 11741). A second laminate (III) having its polyethylene terephthalate film with release coating removed as described above is laminated to the surface of the yellow image and is exposed to a halftone, negative, minus-green color separation film record in registration. The clear, surface treated polyethylene terephthalate film of the second laminate is stripped from the contiguous layer leaving bared an image which is toned with a magenta toner as described above. The process is then repeated for the minus-red (cyan toner) and black negative records. The toners used are described in Example 1 above. This procedure yields a four-color negative surprint proof.

Conventionally the surprint proof is finished by laminating an additional laminate (III) as described above having its polyethylene terephthalate film with release coating stripped therefrom to the outer surface of the four-color proof. The composite element is given an overall exposure with the clear polyethylene terephthalate film cover sheet in place to harden the photopolymerizable layer. The laminate (III) serves to protect the surprint proof. The image, when viewed through the glossy polyethylene terephthalate film has high gloss, a three-dimensional effect and the image is not as sharp as a press sheet.

In place of laminate (III) a fifth layer of positive photopolymer is laminated over the four-color proof as described in Example 1. This layer is exposed through the polyethylene terephthalate support using a mezzotint as described in Example 1 and, after this exposure, the support is stripped from the photopolymer layer and the mixture of particulate materials described in Example 1 is applied thereto as taught in that example. After the excess mixture of particulate materials is removed, a four-color pre-press proof remains with an excellent, uniform matte finish. The finish is clean and dry and closely resembles a press sheet since there is no three dimensional effect.

EXAMPLE 3

This example illustrates that the percent gloss (level of matte) of a four color pre-press proof can be varied by treating the tacky photopolymer layer of the proof with a single particulate material treated with different amounts of a transparentizing oily liquid. Nine (9) samples of four-color proofs are prepared as described in Example 1, and a final layer of unexposed, positive photopolymer laminated as the final coat to each sample as described in that example. The polyethylene terephthalate supports are stripped from each sample and the tacky layers are then treated with cellulose acetate particulate material, ca. 4 to 7μ particle size, to which varying amounts of the transparentizing oily liquid described in Example 1 has been added in order to transparentize the particulate material to varying degrees. The tacky surface of Sample 1, the control is treated with untreated cellulose acetate. The tacky surface of the eight other samples are treated with cellulose acetate to which the amount of transparentizing liquid indicated in Table 1 below has been applied. After wiping off the excess particulate material from the photopolymer layers, the percent of gloss on each is measured using a Gardner Precision Glossmeter, GC 9110, with a 75° angle (Gardner Laboratory, Inc., Bethseda, MD.). The following results are achieved:

TABLE 1

| Sample | Amt. of Transparentizing Liquid in Powder (%) | Gloss (%) |
| --- | --- | --- |
| 1 | 0 | 1.3 (full matte finish) |
| 2 | 30 | 4.2 |
| 3 | 50 | 8.7 |
| 4 | 62 | 8.1 |
| 5 | 70 | 13.9 |
| 6 | 85 | 12.5 |
| 7 | 100 | 13.8 |
| 8 | 110 | 38.8 |
| 9 | 120 | 93.0 |

These data are used to plot the curve shown in FIG. 1 by following the curve from FIG. 1, it is possible to accurately select the desired percentage of gloss (and hence the level of matte) by simply using a particulate material treated with more or less of the transparentizing liquid.

EXAMPLE 4

This example illustrates that the percent gloss (level of matte) of a four-color pre-press proof can be varied by treating the outer tacky layer of the proof with a mixture of two particulate materials in varying amounts both of the particulate materials being treated with the same amount of transparentizing oily liquid.

Sixteen (16) sample proofs are made as described in Example 1 and a layer of unexposed, positive photopolymer is laminated as the final coat to each sample. Eight of these samples are left unexposed (Samples 1 to 8) and the other eight samples are given an exposure to the mezzotint as described in Example 1 (Samples 9 to 16). After removing the polyethylene terephthalate support, various mixtures of rice starch and cellulose acetate particulate material each treated with 30% of the transparentizing liquid described in Example 1 are applied to the surface of each sample. After each sample is treated and the excess particulate material removed, the percent of gloss is measured as described in Example 3. The following results are found:

TABLE 2

| % Rice Starch in Mixture | Sample | Gloss (%) | Sample | Gloss (%) |
| --- | --- | --- | --- | --- |
| 0 | 1 | 4.2 | 9 | 49.0 |
| 50 | 2 | 7.8 | 10 | 49.0 |
| 85 | 3 | 10.7 | 11 | 51.1 |
| 95 | 4 | 10.9 | 12 | 65.0 |
| 96.25 | 5 | 25.0 | 13 | 69.0 |
| 98 | 6 | 27.3 | 14 | 72.7 |
| 99 | 7 | 76.0 | 15 | 79.0 |
| 100 | 8 | 91.6 | 16 | 93.4 |

These data are used to plot the two curves found in FIG. 2.

EXAMPLE 5

Forty samples of a black toned photopolymerized layer are prepared as described in Example 1. A photopolymerizable layer is laminated over the black layer as described in Example 1. The polyethylene terephthalate film is removed and to the tacky surface is applied by means of a fiber pad dipped in a transparentized particulate material as described in Table 3 below and wiped across the tacky layer. The surface is then wiped with a cotton cloth to remove excess particulate material. The percent gloss for the numbered samples is set forth in Table 3 wherein A is the transparentizing liquid described in Example 1.

B is mineral oil

C is silicone oil

D is Avitex®LCP quarternary ammonia surface active agent, E. I. du Pont de Nemours and Company, Wilmington, DE.

E is a mixture of monomers: trimethylolpropanetriacrylate (81.8)/(triacrylate of oxyethylated trimethylolpropane) (18.2).

TABLE 3

| Sample | Particulate Material (μ) | Oil Absorptivity (%) | Transparentizing Liquid (%) | Gloss (%) |
|---|---|---|---|---|
| Control | Cellulose Acetate (4-6) | 172-178 | (0) | 1.3 |
| 1 | Cellulose Acetate (4-6) | | A (35) | 8.9 |
| 2 | Cellulose Acetate (4-6) | | A (50) | 8.7 |
| 3 | Cellulose Acetate (4-6) | | A (62) | 8.1 |
| 4 | Cellulose Acetate (4-6) | | A (70) | 13.9 |
| 5 | Cellulose Acetate (4-6) | | A (70) | 13.4 |
| 6 | Cellulose Acetate (4-6) | | A (85) | 12.5 |
| 7 | Cellulose Acetate (4-6) | | A (100) | 13.8 |
| 8 | Cellulose Acetate (4-6) | | A (110) | 38.8 |
| 9 | Cellulose Acetate (4-6) | | A (120) | 93.0 |
| Control | Rice Starch (7.0) | 90-105 | (0) | 2.5 |
| 10 | Rice Starch (7.0) | | A (15) | 2.2 |
| 11 | Rice Starch (7.0) | | A (30) | 91.6 |
| 12 | Rice Starch (7.0) | | B (25) | 94.3 |
| 13 | Rice Starch (7.0) | | C (25) | 71.0 |
| 14 | Rice Starch (7.0) | | D (25) | 39.5 |
| 15 | Rice Starch (7.0) | | E (25) | 12.1 |
| Control | Diatomaceous Silica (10-25) HSC Celite ®* | 201-208 | (0) | 7.6 |
| 16 | Diatomaceous Silica (10-25) HSC Celite ®* | | A (40) | 87.9 |
| 17 | Diatomaceous Silica (10-25) HSC Celite ®* | | A (50) | 90.3 |
| 18 | Diatomaceous Silica (10-25) HSC Celite ®* | | B (40) | 71.5 |
| 19 | Diatomaceous Silica (10-25) HSC Celite ®* | | C (40) | 81.1 |
| 20 | Diatomaceous Silica (10-25) HSC Celite ®* | | D (40) | 36.5 |
| 21 | Diatomaceous Silica (10-25) HSC Celite ®* | | E (40) | 9.0 |
| Control | Van-Son ® Vegetable Spray Powder (14.0)** | 52-65 | (0) | 12.9 |
| 22 | Van-Son ® Vegetable Spray Powder (14.0)** | | A (10) | 20.0 |
| 23 | Van-Son ® Vegetable Spray Powder (14.0)** | | A (20) | 96.1 |
| 24 | Van-Son ® Vegetable Spray Powder (14.0)** | | B (10) | 94.8 |
| 25 | Van-Son ® Vegetable Spray Powder (14.0)** | | C (10) | 92.4 |
| 26 | Van-Son ® Vegetable Spray Powder (14.0)** | | D (10) | 6.5 |
| 27 | Van-Son ® Vegetable Spray Powder (14.0)** | | E (10) | 1.5 |
| Control | Diatomaceous Silica (Celite® 281) (5-8)* | 153-176 | (0) | 15.2 |
| 28 | Diatomaceous Silica (Celite® 281) (5-8)* | | A (30) | 42.3 |
| Control | Diatomaceous Silica (5-10) Celite® 499* | 210-226 | (0) | 15.4 |
| 29 | Diatomaceous Silica (5-10) Celite® 499* | | A (50) | 73.4 |
| 30 | Diatomaceous Silica (5-10) Celite® 499* | | A (60) | 84.3 |
| 31 | Diatomaceous Silica (5-10) Celite® 499* | | B (50) | 75.2 |
| 32 | Diatomaceous Silica (5-10) Celite® 499* | | C (50) | 64.9 |
| 33 | Diatomaceous Silica (5-10) Celite® 499* | | D (50) | 29.9 |
| 34 | Diatomaceous Silica (5-10) Celite® 499* | | E (50) | 4.0 |

*Celite ® is a registered trademark of Johns Manville Products Corp., New York, NY
**Van-Son ® Vegetable Spray Powder is manufactured by Holland Ink Corp., Mineola, NY

EXAMPLE 6

Compositions similar to those described in Example 1 (positive working elements) and Example 2 (negative working elements) are prepared. Instead of dusting on the pigmented toners of each exposed layer by hand as described in those examples, the elements are toned using the automatic toning apparatus described in Tobias, U.S. Pat. No. 4,069,791. As a final layer, a layer of positive working photopolymer (as described in Example 1) is laminated to each of the resulting four-color proofs. The proofs are given an over-all exposure through a mezzotint as described in Example 1, and the support layer is stripped off. The elements are then placed into the above-described toning apparatus with the transparentized mixture of powders described in Example 1 substituted for the pigmented toners. The resulting images are clean, dry, free of 3-dimensional appearance and with the following gloss:

Positive surprint proof 43.0%
Negative surprint proof 47.0%

I claim:

1. Process for modifying a tacky surface of a surprint multicolor proof having at least two nonplanar, nonsilver halide colored photoimaged elements sequentially bonded to a support, and a photosensitive tacky layer present as the outer layer of the proof by adhering to the tacky layer at least one particulate material having an oil absorptivity of at least 30% by weight based on the weight of particulate material as determined by the Gardner-Coleman Method, A.S.T.M. D-1483-60 and an average particle size of 0.1 to 20μ which comprises
   (1) applying the particulate material to the tacky surface, and
   (2) removing excess particulate material therefrom, the improvement wherein prior to application to the tacky surface the particulate material is treated with at least 5% by weight of a transparentizing oily liquid having a boiling point greater than 100° C. whereby the particulate material is made transparent.

2. A process according to claim 1 wherein the transparentized particulate material is a mixture of at least two particulate materials treated with a transparentizing oily liquid.

3. A process according to claim 2 wherein the particulate materials are starch and cellulose acetate.

4. A process according to claim 1 wherein prior to application to the tacky surface of transparentized particulate material the photosensitive tacky layer is exposed through a screen tint.

5. A process according to claim 1 wherein the photosensitive tacky layer is a photohardenable layer.

6. A process according to claim 1 wherein the tacky surface is present on an element containing nontonable image areas and tacky nonphotosensitive image areas.

7. A process according to claim 1 wherein each colored photoimaged element has been exposed through a different color separation negative and colored in a special region corresponding to the color separation negative used for the exposure.

8. A process according to claim 7 wherein four photoimaged elements are present in the surprint multicolor proof and the elements and color separation negatives correspond, respectively, to yellow, magenta, cyan and black.

9. A process according to claim 1 wherein colorant material is applied to the tacky surface with the particulate material.

10. A process according to claim 1 wherein the transparentized particulate material is taken from the group consisting of corn starch, rice starch, diatomaceous silica, cellulose acetate, silica-gel and vegetable powder.

11. A process according to claim 1 wherein the transparentizing oily liquid is taken from the group consisting of nonionic condensation product of ethylene oxide, mineral oil, silicone oil, nonionic polyoxyethylene lauryl ether, quartenary ammonia surface active agent, and a mixture of monomeric compounds.

12. A process according to claim 1 wherein to the tacky surface is applied a mixture of a transparentized particulate material and a particulate material free from treatment with transparentizing oily liquid.

* * * * *

UNITED STATES PATENT AND TRADEMARK OFFICE
CERTIFICATE OF CORRECTION

PATENT NO. : 4,427,761
DATED : January 24, 1984
INVENTOR(S) : Magalie Marie Charles It is certified that error appears in the above—identified patent and that said Letters Patent is hereby corrected as shown below:

Column 4, line 37, "Numours" should be -- Nemours --.

Column 14, line 15, "special" should be -- spectral --.

Signed and Sealed this

Twenty-third Day of April 1985

[SEAL]

Attest:

DONALD J. QUIGG

Attesting Officer          Acting Commissioner of Patents and Trademarks